United States Patent [19]
Collins et al.

[11] Patent Number: 5,187,454
[45] Date of Patent: Feb. 16, 1993

[54] ELECTRONICALLY TUNED MATCHING NETWORK USING PREDICTOR-CORRECTOR CONTROL SYSTEM

[75] Inventors: Kenneth S. Collins, San Jose; John R. Trow, Santa Clara; Craig A. Roderick; Jay D. Pinson, II, both of San Jose; Douglas A. Buchberger, II, Tracy, all of Calif.

[73] Assignee: Applied Materials, Inc., Santa Clara, Calif.

[21] Appl. No.: 825,658

[22] Filed: Jan. 23, 1992

[51] Int. Cl.$^5$ .............................................. H03H 11/30
[52] U.S. Cl. ...................................... 333/17.3; 333/32
[58] Field of Search ........................ 333/17.3, 99 PL; 343/861; 455/123, 125

[56] References Cited

U.S. PATENT DOCUMENTS

| | | | |
|---|---|---|---|
| 4,375,051 | 2/1983 | Theall | 333/17.3 |
| 4,621,242 | 11/1986 | Theall, Jr. et al. | 333/17.3 |
| 4,951,009 | 8/1990 | Collins et al. | 333/17.3 |

FOREIGN PATENT DOCUMENTS

174803 7/1991 Japan .................................. 333/17.3

*Primary Examiner*—Paul Gensler
*Attorney, Agent, or Firm*—Noel F. Heal

[57] ABSTRACT

A method, and corresponding apparatus, for matching a generator impedance with an unknown and possibly changing load impedance, to maximize power transferred to the load. The apparatus includes an impedance matching network, and a network model, to estimate the load impedance from known present network values and a measurement of network input impedance, and to estimate optimum network values from the input impedance and the estimated load impedance. A controller computes new network values based on the present and optimum values, and outputs the new values to the network. The process is repeated using the new network values to estimate the load impedance and generate a new set of optimum values. The controller uses a control equation with parameters selected to ensure rapid convergence on the maximum-power condition, without overshoot or instability. Preferably, current and voltage measurements are made in the network to enable correction of the network values based on these measurements on the actual network. Although the invention may be used with any type of variable-impedance network hardware, preferably current-controlled inductances are used as the variable network impedances.

38 Claims, 5 Drawing Sheets

ELECTRONICALLY TUNED MATCHING NETWORK USING PREDICTOR-CORRECTOR CONTROL SYSTEM

BACKGROUND OF THE INVENTION

This invention relates generally to impedance matching networks, for matching a source impedance with a load impedance, and, more particularly, to impedance matching networks in which network values are dynamically adjusted to converge on a solution initially, when the load impedance is unknown, and later, as the load impedance changes. A common goal in connecting a source of electrical power to an electrical load is to maximize the power transfer from the source to the load. This goal is met when the output impedance of the source, or generator, is equal to the complex conjugate of the input impedance of the load.

By way of brief background, in alternating current (ac) circuits, impedance has a resistive component, referred to as the real component, and an inductive or capacitive component, referred to as the imaginary component. In conventional complex number notation, an impedance Z is given by $Z = R + jX$, where R is the real component, X is the imaginary component, and j is an operator equal to the square root of minus one. Impedances are said to be complex conjugates when their resistive components are equal and their imaginary components are equal in magnitude but opposite in sign. If a generator impedance is $Z_G = R_G + jX_G$, then maximum power will be transferred to a load when the load impedance is $Z_L = R_G - jX_G$. Another way of thinking of complex conjugates is in terms of vector quantities. A simple resistive impedance may be thought of as a vector with a phase angle of zero. A complex impedance has a magnitude and a phase angle. Impedances that are complex conjugates of each other have equal magnitudes, but phase angles of equal magnitude and opposite sign.

In many circuit applications, the source or generator impedance does not match the load impedance, and an impedance matching network may be connected between the source and the load. Basically, the function of the impedance matching network is to present to the generator an impedance equal to the complex conjugate of the generator impedance, and to present to the load an impedance equal to the complex conjugate of the load impedance. The matching network contains a number of interconnected inductors and capacitors, some of which are adjustable in value to achieve the desired result. Some forms of impedance matching networks operate on the assumption that the magnitude of the network input impedance can be varied by adjusting a particular network value, and that the phase angle of the network input impedance can be independently varied by adjusting another network value. Unfortunately, the assumption is not always correct, even over a narrow range of adjustment, and such a network may easily converge on a false solution, in which either the magnitude or the phase angle may be appropriately matched, but not both.

U.S. Pat. No. 4,951,009 issued in the names of Collins et al., entitled "Tuning Method and Control System for Automatic Matching Network," discloses and claims an improved technique for controlling an impedance matching network. Two variable impedances are cyclically varied, or "dithered," about steady-state values, and the effect of the dithered impedance values on the power reflected from the matching network is observed. The steady-state values of the impedances are continually adjusted to minimize the reflected power, which is indicative of the degree of impedance matching achieved. Dithering the network values allows the determination of partial derivatives, i.e. the rates of change of the reflected power with respect to each network value. Each network value can then be varied until both partial derivatives are practically zero. Although this approach works satisfactorily over a narrow range, it is also susceptible to converging on a false local minimum solution in the characteristic surface relating the reflected power to the variable network values. Although the characteristic may be approximately a paraboloid in shape, with a definite minimum value at which the partial derivatives in both directions are zero, there may be false solutions at which the partial derivatives are zero but a true absolute minimum reflected power has not been achieved.

It will be appreciated from the foregoing that there is still a need for improvement in the field of dynamically adjustable impedance matching networks. The need is particularly acute in the field of plasma processing, as used in the fabrication of semiconductor circuitry. When the electrical load is a plasma, the load impedance is dynamic and nonlinear, and changes as more power is coupled to it, and as other variables, such as gas pressure and composition, are changed. Therefore, although the load impedance may be measured or estimated, for purposes of adjusting a matching network to optimize power transfer, the load impedance will change whenever the network values are adjusted. Accordingly, a dynamically adjustable network is essential for efficiently coupling power to a plasma. The present invention provides an elegant solution to the problems outlined above, as summarized below.

SUMMARY OF THE INVENTION

The present invention resides in an impedance matching network that is dynamically adjusted by means of a network model that accurately predicts and estimates network performance. The network includes at least two variable impedances of which the impedance values may be selected by applying appropriate control signals. The invention includes a mathematical model of the matching network, the principal function of which is to determine the optimum network values that will result in maximum transfer of power to the load, based on a recent observation of network input impedance and a recent estimate of the load impedance. The network values are adjusted to be closer to the optimum values obtained from the network model, and then revised optimum values are obtained, based on a new measurement of network input impedance and a new estimate of load impedance. The process continues until the network values converge on a solution in which power transfer is maximized.

Briefly, and in general terms, the method of the invention includes the steps of: (a) connecting an impedance matching network, having at least two variable impedances, between an electrical generator and an electrical load, the network having input terminals connected to the generator and output terminals connected to the load; (b) taking electrical measurements in the network to estimate the load impedance; (c) computing, in a model of the network, a set of optimum network values corresponding to the variable impedances, such that there would be a desired impedance match between the generator and the load if the estimated load impedance did not change; (d) adjusting the actual network values in a direction toward the optimum network values; and (e) repeating steps (b), (c) and (d) until the desired degree of impedance matching is obtained.

In the presently preferred embodiment of the invention, the step of adjusting the actual network values includes computing for each network value a difference between the present network value and the optimum network value; multiplying the difference for each network value by a selected scaling factor, to obtain a correction value; and then adjusting each network value by the corresponding correction value.

The selected scaling factor may include a fixed constant value, usually less than unity, and a measured quantity indicative of the degree to which the network does not provide a desired impedance match. Therefore, smaller corrections will be made as the network approaches the desired impedance match. For example, the measured quantity can be the reflection coefficient magnitude. A low reflection coefficient magnitude is indicative of a high degree of impedance matching.

The method may also include the steps of determining whether a selected threshold level of convergence on the impedance matching condition has been reached; and, if it has, modifying each correction value to include an additional component proportional to an accumulated product of difference value and elapsed time between samples. The additional component provides for an increased correction value to accelerate convergence in its latter stages.

Another important aspect of the invention is characterized by the additional step of correcting the network model to reflect actual network values measured in the network. Current and voltage measurements taken in the network itself are used to compute impedance values of network components, and these are used to correct the model. Network values developed by the model are used to calculate corrected network values, which are output to the network in the form of control currents applied to current-controlled impedances. Without periodic correction, the model would have to rely on possibly outdated calibration information relating impedance control currents to actual impedance values in the network.

In terms of apparatus, the invention comprises (a) an impedance matching network, having at least two variable impedances, connected between an electrical generator and an electrical load, the network having input terminals connected to the generator and output terminals connected to the load; (b) means for initializing the network values to preselected initial values; (c) means for determining a network input impedance from measurements taken at the input terminals of the network; (d) a network model, for estimating the load impedance from the network input impedance and the network values, and for estimating optimum network values from the estimated load impedance and a desired network input impedance that is usually, but not necessarily, the complex conjugate of the generator impedance; and (e) a system controller, for computing new network values from the present and optimum values, adjusting the present network values to the new values, and iteratively initiating operations of the network model to obtain revised optimum values, until there is a desired degree of convergence with a condition of maximum power transfer. In some cases, a target input impedance other than complex conjugate of the generator impedance, which would produce maximum power transfer from generator to load, may be desired. For example, slightly detuning from the maximum power condition may be used to improve the stability of the load, or the matching network, or both.

Other variants of the apparatus are possible, similar in scope to the method form of the invention discussed above.

In an important application of the invention, the electrical load is a plasma process. In a particular plasma process, power is coupled to the process by two different means. Source power for the process is inductively coupled into a process chamber, and bias power is applied through a bias electrode in the chamber. In accordance with one aspect of the invention, the apparatus includes a matching network and a network model for each of these loads, and impedance matching of the bias load is not initiated until the principal, inductively coupled, load is impedance-matched to a desired degree.

It will be appreciated from the foregoing that the present invention represents a significant advance in the field of impedance matching networks. In particular, the network values are dynamically adjusted based on estimates provided by a network model, and the network rapidly converges on a solution in which power transfer to the load is maximized. Performance of the network is further enhanced because the network impedance values are periodically calculated, and the model updated, based on current and voltage measurements taken in the network itself. Other aspects and advantages of the invention will become apparent from the detailed description that follows, taken in conjunction with the accompanying drawings.

DESCRIPTION OF THE PREFERRED EMBODIMENT

Figure 1:
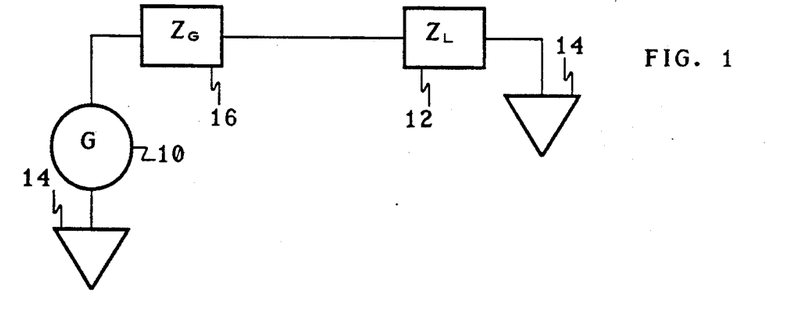
FIG. 1 is a block diagram showing a power generator driving a load.

As shown in the drawings for purposes of illustration, the present invention is concerned with impedance matching networks, for connection between a power generator and a load. In FIG. 1, an alternating current (ac) generator, indicated by reference numeral 10 is connected to an electrical load 12. One terminal of the generator and one terminal of the load are connected to ground, as indicated at 14. Maximum power transfer from the generator 10 to the load 12 occurs when the output impedance $Z_G$ of the generator, indicated at 16, is the complex conjugate of the impedance $Z_L$ of the load 12.

Figure 2:
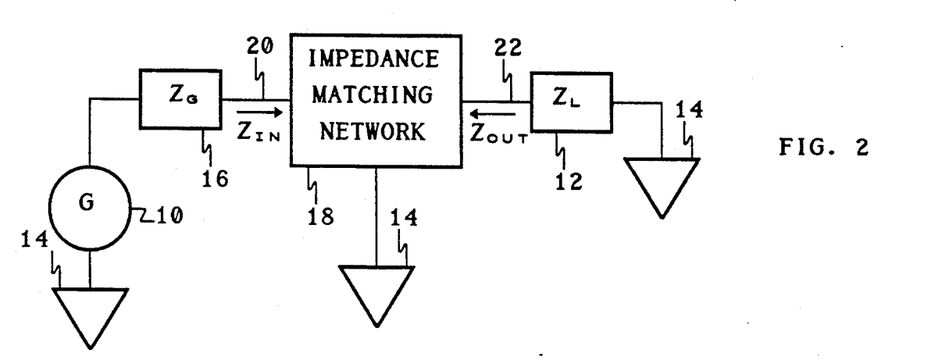
FIG. 2 is a block diagram showing a matching network connected between a power generator and a load.

Typically, generator and load impedances do not match exactly, and an impedance matching network 18 is installed between the generator 10 and the load 12, as shown in FIG. 2. Typically, the generator impedance 16 is purely resistive for most practical purposes, and is indicated in FIG. 2 as having a value $Z_G$. The input impedance of the network 18 with the load connected, as seen looking into the network on input line 20, is $Z_{IN}$, and the output impedance of the network, with the generator connected, as seen looking back into the network on output line 22, is $Z_{OUT}$. To maximize power transfer from the generator 10 to the load 12, $Z_{IN}$ is the complex conjugate of $Z_G$, and $Z_{OUT}$ is the complex conjugate of $Z_L$.

Figure 3:
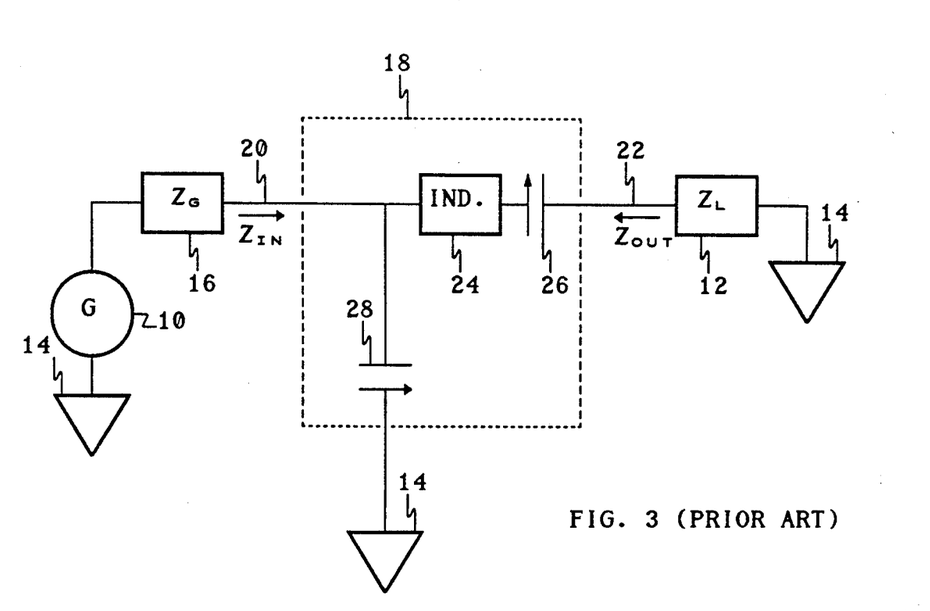
FIG. 3 is an example of a prior art matching network.

FIG. 3 shows a prior version of a matching network 18, including an inductor 24 and a variable capacitor 26 connected in series between input line 20 and output line 22, and a second variable capacitor 28 connected between input line 20 and ground. The capacitance values of capacitors 26 and 28 are varied in an effort to produce a value of $Z_{IN}$ that is equal in magnitude to $Z_G$ and has a zero phase angle (if $Z_G$ is purely resistive). Operation of the matching network is based on an incorrect assumption that the impedance magnitude and phase angle can be adjusted independently of each other.

An improved technique for adjusting an impedance matching network is disclosed and claimed in U.S. Pat. No. 4,951,009, wherein power reflected out of the network, as measured on line 20, is minimized by observing the effect of dithering the network values and adjusting their steady-state values accordingly. Although the technique is satisfactory in many situations, it may still converge on a false solution.

In accordance with the invention, the variable network values are iteratively adjusted to converge on a solution based on values that are repeatedly predicted by a mathematical model of the network. As noted earlier, the typical situation involving impedance matching is one in which the generator or source impedance is fixed and the load impedance is unknown and may vary. In such a context, the task of impedance matching can be viewed as adjusting the network values until the input impedance $Z_{IN}$ matches the conjugate of the generator impedance $Z_G$. For convenience, the invention will be described in this context, but it will be understood that the approach could be modified to handle a situation in which the generator impedance was subject to variation instead of, or as well as, the load impedance.

Figure 4:
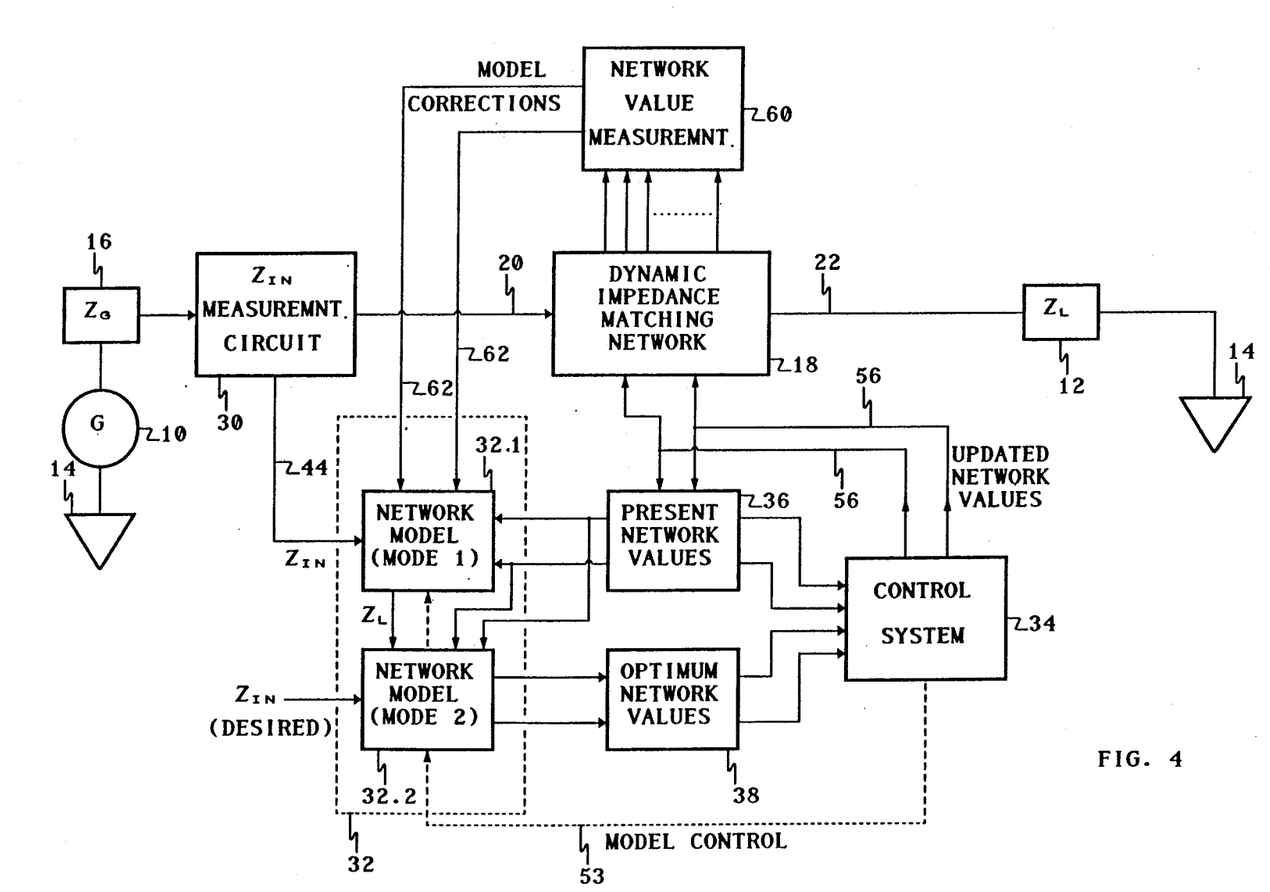
FIG. 4 is a block diagram of a matching network and related control system of the present invention.

As shown in FIG. 4, the impedance matching technique of the invention includes an impedance matching network 18, an impedance measuring circuit 30 installed in input line 20, a network model 32, indicated as having two logical components 32.1 and 32.2, and a control system 34. As will shortly be discussed in detail, the network model 32 uses a set of present network parameters, indicated at 36, and periodically generates a set of predicted optimum network parameters, indicated at 38.

Figure 5:
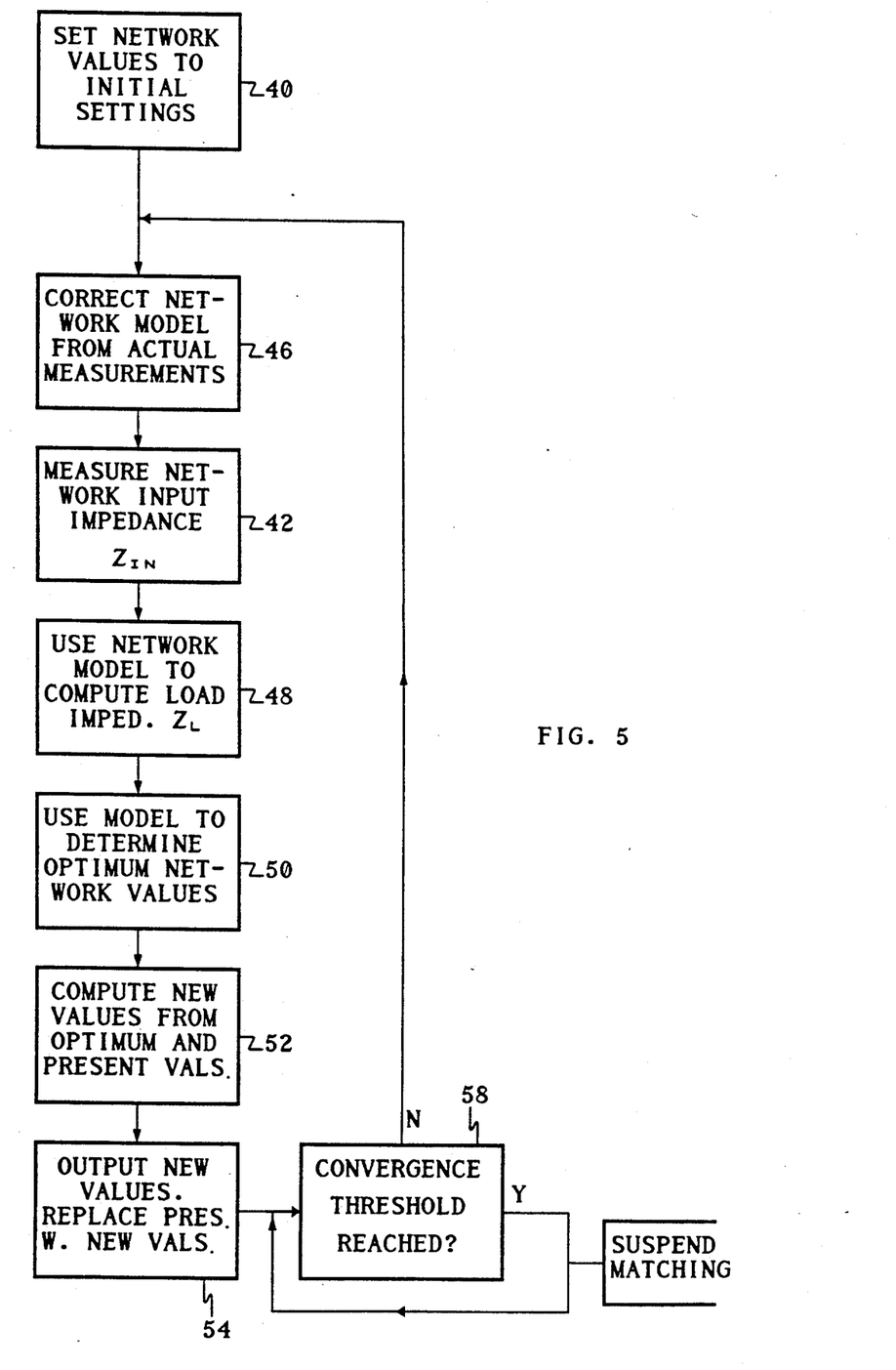
FIG. 5 is a flowchart showing the functions performed in dynamically adjusting a matching network in accordance with the present invention.

Operation of the invention will now be described with reference to FIG. 4, and with simultaneous reference to FIG. 5, which is a flowchart depicting the functions performed in adjusting the network parameters. Initially, when the system is first activated, the present network parameters 36 are preset with preselected initial values, as indicated in block 40 (FIG. 5). Then the input impedance $Z_{IN}$ is measured in circuit 30, as indicated in block 42 (FIG. 5). This circuit may measure $Z_{IN}$ directly, or may measure some other quantity from which $Z_{IN}$ may be simply derived. For example, the circuit may determine a reflection coefficient $\Gamma$ by measuring voltages on line 20 in a forward and reverse direction. A conventional directional coupler can be used for this purpose. The magnitude of the reflection coefficient, usually indicated as $|\Gamma|$, is the ratio of the reflected voltage to the forward voltage, and has a value between zero and one. The phase angle of the reflection coefficient $\Gamma$ can be determined with the help of a phase detector. The corresponding value of $Z_{IN}$ can be computed from $\Gamma$ and a knowledge of $Z_o$, where $Z_o$ is the transmission line characteristic impedance, i.e. the characteristic impedance of the directional coupler used to measure forward and reflected input voltage, and is typically the complex conjugate of $Z_G$. Alternatively, the circuit 30 can measure the voltage standing wave ratio (VSWR) at the input of the network 18 and $Z_{IN}$ can be computed from the result. A perfect match would result in a VSWR of 1.0, corresponding to a reflection coefficient of zero. In any event, circuit 30 provides a measure of $Z_{IN}$ on line 44 to the network model 32.1.

The network model 32 is a mathematical equivalent, using electronic computational components, of the matching network 18. That is to say, the model 32 is based on circuit equations derived from conventional ac circuit theory, and is capable of determining the values of unknown circuit parameters if a sufficient number of other parameters are known. Prior to performing these functions, the model 32 has its values corrected, as indicated in block 46 (FIG. 5), but discussion of this function will be deferred until the basic modes of operation are reviewed. More specifically, the circuit model 32 operates in two modes for purposes of the invention. In its first mode, indicated in block 32.1 (FIG. 4) and block 48 (FIG. 5), the model uses the present network parameters 36 and the measured value of $Z_{IN}$, from circuit 30, to compute an estimated value of the load impedance $Z_L$. This is simply a matter of solving the conventional equations that define the network, for the unknown value of $Z_L$ which may not be directly measurable.

Having determined a present value for $Z_L$, the network model operates in its second mode, indicated in block 32.2 (FIG. 4) and block 50 (FIG. 5). Using the computed value of $Z_L$ and the desired value of the input impedance $Z_{IN}$ (i.e. usually, but not necessarily, the conjugate of the generator impedance), the model determines optimum network values that are consistent with these values of $Z_L$ and $Z_{IN}$. Again this is a relatively simple matter in mathematical terms, since the other network parameters are known. The optimum values computed by the model are indicated at 38 (FIG. 4).

If the load impedance was "well behaved" and did not vary with the amount of power transferred to it, these optimum network values could be simply output to the network and, if the calculations were correctly made, the optimization task would be complete. In the general case, however, and in many practical applications, the load impedance is nonlinear and varies with the amount of power transferred to it. Consequently, an essential part of the invention is the control system 34, the principal function of which is to compute new network values, as indicated in block 52 (FIG. 5), based on the present values and the most recently computed optimum values. The control equation used for this purpose will be discussed in detail below. It is sufficient for the moment to understand that the computed new values are selected to provide rapid convergence on the desired solution, but without overshoot or instability. Another function of the control system 34 is to initiate operations of the network model 32, as indicated by line 53. In other words, the control system 34 generates timing signals (not shown), which control the sequence of operations described with respect to the flowchart of FIG. 5.

The computed new network values are output to the actual network 18, as indicated in block 54 (FIG. 5). The network values are controlled by output signals transmitted over lines 56 (FIG. 4) to the network 18. Depending on the specific network design, the controlled network values may be variable capacitances or variable inductances. Typically devices of this type may be varied over a range of values above or below a nominal value. Varying the network values may be accomplished by electromechanical means, such as by moving sliding contacts or capacitor plates. More desirably, network values are varied without the use of moving components. U.S. Pat. No. 4,951,009 discloses a variable inductor of which the inductance value can be controlled by varying the current in a direct current (dc) control winding. In the presently preferred embodiment of the invention, the variable impedances in the matching network 18 are electrically variable inductances of the same general type as disclosed in the aforementioned patent.

When the new network values have been output to the network 18, these become the "present" values for the network model 32. Therefore, the new values on lines 56 are also used to update the present values indicated at 36 (FIG. 4). At the completion of the steps described in block 54 (FIG. 5), the network values will have been adjusted to be closer to the desired condition of maximum power transfer. The next step, in block 58, determines whether the condition has been reached to some desired degree of convergence. One way to determine this is to examine $|\Gamma|$, the magnitude of the reflection 35 coefficient. If the circuit 30 determines $Z_{IN}$ from reflection measurements, this quantity is conveniently available from circuit 30. In any event, if $|\Gamma|$ is less than some desired threshold, such as 0.1 for example, the process of adjusting network values can be suspended until such time as the load impedance $Z_L$ changes enough to increase the value of $|\Gamma|$ above the threshold again. This is shown diagrammatically in the flowchart by looping back on block 58 if convergence has been reached. If convergence has not been reached, or if the load impedance has changed sufficiently since convergence, the sequence of steps beginning with block 42 is repeated. That is to say, the input impedance $Z_{IN}$ is measured again, the load impedance $Z_L$ is calculated in the network model, new optimum network values are calculated in the network model, and new network values are calculated in the control system. The new network values are output to the network and used in the next iteration as the present values. This iterative process continues until a desired degree of convergence is achieved.

Up to this point, the term "network values" has been used somewhat loosely to encompass electrical parameters of variable components of the network 18 and control values that are output to the network to effect a change in the variable components. Implicit in the model 32 is an assumption that there is a fixed and known relationship between the control values and the resultant variable component value in the network. For example, if a variable component is a variable inductance, the model 32 has built into it the relationship between a command signal, such as a current in amperes or milliamperes and the resultant inductance value in millihenries. The present network values 36 and the predicted network values 38 could be in the form of control currents, or in the form of inductance values, or factors applied to nominal inductance values. If the network values are control currents, these would be converted to inductances by the model, to calculate $Z_L$ and then to calculate optimum inductance values, which would be immediately converted to control currents for manipulation by the control system. Alternatively, the present and optimum network values 36, 38 could be in the form of inductances, in which case the control system 34 would need to make a conversion to control currents before outputting new network values on lines 56. It will be assumed here that the former alternative is used, i.e. that the control system 34 operates solely on control currents (or voltages), and that the network model 32 contains sufficient information to effect conversions to and from inductance values.

An inherent difficulty in any system in which impedances are varied by means of a control signal is that there may not be always perfect calibration between the commanded impedance value and the actual impedance value. Even if the components are perfectly calibrated initially, actual impedance values are almost always subject to drift away from their intended settings as time passes and temperature varies. An important aspect of the present invention is that the actual impedance values are monitored by measuring voltages and currents in the network 18, as indicated in block 60 (FIG. 4), and this information is fed back to the network model 32, as indicated by lines 62 (FIG. 4). In the model 32, as indicated in block 46 (FIG. 5), a previously stored relationship, between control currents (present network parameters) and actual impedance values, is adjusted as a result of the actual impedance measurements within the network. Thus the model 32 uses actual network impedances to calculate the load impedance $Z_L$ and to calculate optimum network values. Although the invention will operate quite well without adjusting the network model for consistency with measured impedance values, this feature makes the invention much more reliable in practice. Without continual correction of the model to compensate for impedance drift, there is always the possibility of convergence on a false solution. Two network model examples, included below, contain the calculations necessary to make the model corrections based on measured currents and voltages.

The control equation used in control system 34 is based primarily on a conventional proportional control system, with some modifications. In the following example, the network values are represented by the symbols I and J, respectively, to control two variable impedances in the network. The present network values are indicated by $I_{PRESENT}$ and $J_{PRESENT}$, respectively. When the system is first started, as shown in block 40 (FIG. 5), the present network values are preset to initial values:

$$I_{PRESENT}=I_0 \text{ and } J_{PRESENT}=J_0.$$

In block 50, the model 32 computes optimum network values, represented by $I_{OPTIMUM}$ and $J_{OPTIMUM}$. The control system 34 computes two difference values, as follows:

$$\Delta_I = I_{PRESENT} - I_{OPTIMUM}.$$

$$\Delta_J = J_{PRESENT} - J_{OPTIMUM}.$$

In a simple proportional control technique, new values of I and J are computed as follows:

$$I_{NEW} = I_{PRESENT} - k_{pI}\Delta_I,$$

$$J_{NEW} = J_{PRESENT} - k_{pJ}\Delta_J.$$

where $k_{PI}$ and $k_{PJ}$ are proportional control factors having values less than one. Depending on the factors selected, the network values will converge at some selected rate on the desired solution. For more effective control of the speed of convergence and the stability of the solution obtained, two additional factors are preferably used in the control equation, as follows:

$$I_{NEW} = I_{PRESENT} - K_{pI}\Delta_I|\Gamma| - k_I \Sigma \Delta_I \Delta_T$$

$$J_{NEW} = J_{PRESENT} - K_{pJ}\Delta_J|\Gamma| - k_J \Sigma \Delta_J \Delta_T,$$

where $|\Gamma|$ is the magnitude of the reflection coefficient measured in circuit 30, $k_I$, $k_J$ are constants, and the summation terms $\Sigma \Delta_I \Delta_T$ and $\Sigma \Delta_J \Delta_T$ are calculated conditionally, only if the reflection coefficient magnitude $|\Gamma|$ is below a selected enabling value.

Adding the factor $|\Delta|$ in the first term of each equation provides an automatic gain control feature. Initially, when the network is a long way from convergence, the magnitude $|\Delta|$ is likely to be close to unity, and has little effect on the rate of convergence. As convergence is approached, the magnitude $|\Delta|$ is closer to zero, and the rate of convergence is slowed down accordingly, and the possibility of overshoot is reduced, by the presence of the reflection coefficient magnitude in the control equation. The summation term in each equation provides an integral control function that tends to speed up convergence if the difference between the present value and the optimum value has been significant over a period of time. The summation term is computed from the product of an error term and an elapsed time (between samples) term. Thus it represents a difference integrated with respect to time. However, the summation terms are only effective for small values of reflection coefficient magnitude $|\Delta|$. Therefore, the summation terms tend to speed up completion of convergence once a desired degree of convergence has been achieved. Use of these features in the control equation governing operation of the control system 34 achieve a reliable and rapid convergence on the maximum-power solution that is desired. With appropriate adjustment of the control constants in a particular system, convergence on the maximumpower solution takes place extremely rapidly, for example in only about two seconds, when the time between samples ($\Delta_T$) is 0.1 second.

Figure 6:
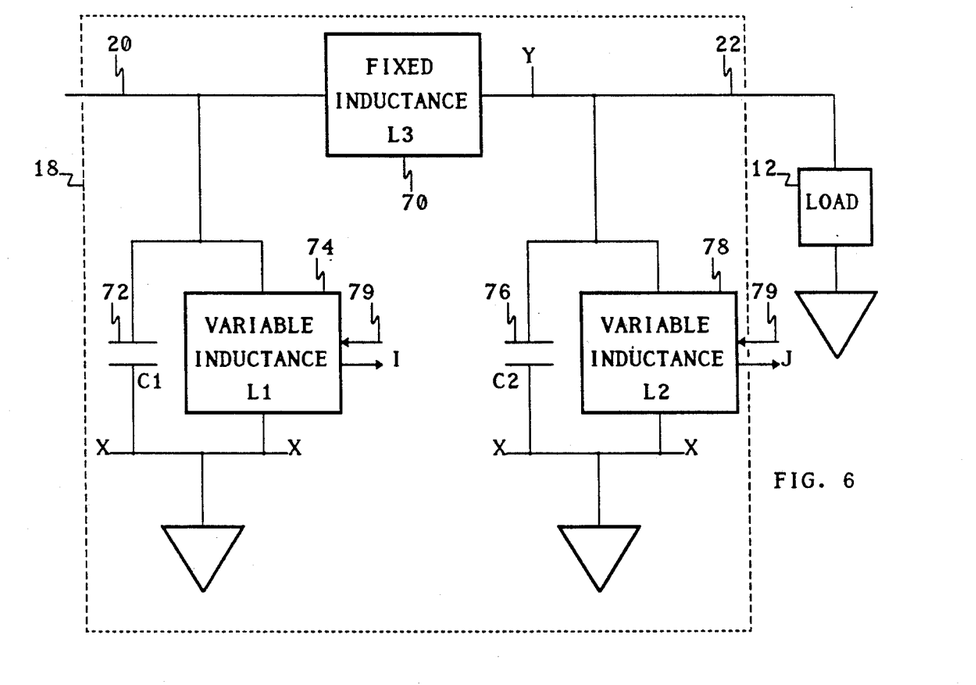
FIGS. 6 and 7 are block diagrams of illustrative network configurations.
Figure 7:
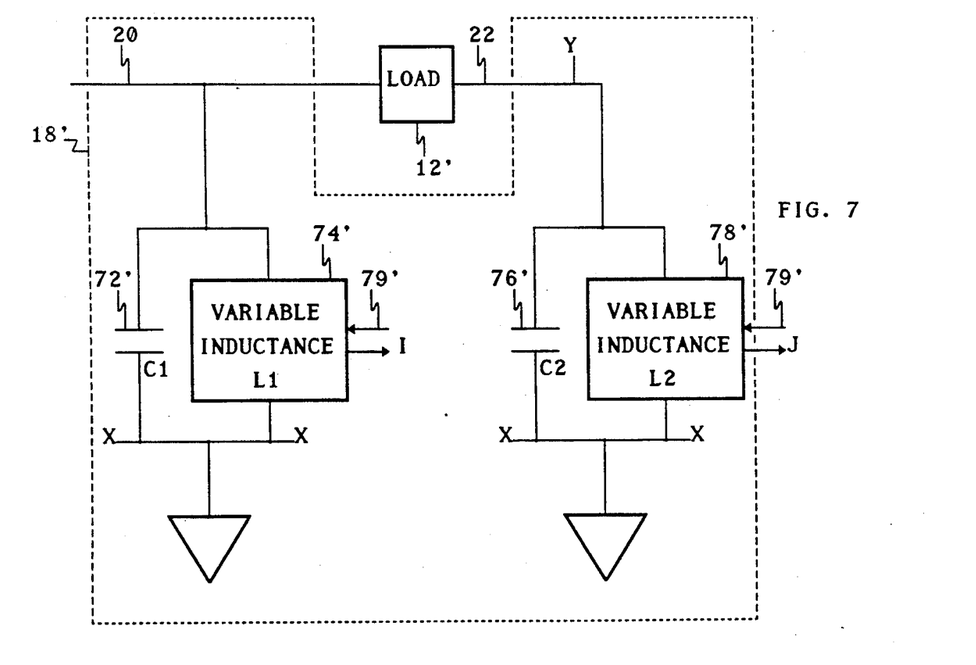

There are two important configurations of the matching network and the manner in which the load is connected to the network, one in which the load impedance includes a capacitive component and the other in which the load impedance includes an inductive component. The two configurations are shown in FIGS. 6 and 7, respectively. In FIG. 6, the network is in a pi configuration, including a fixed series inductor 70 and two shunt circuits, one on each side of the fixed inductor. The first shunt circuit, in parallel with the generator (not shown in FIG. 6) has a fixed capacitor 72 and a variable inductor 74 connected in parallel. The other shunt circuit, in parallel with the load 12, has fixed capacitor 76 and a variable inductor 78 connected in parallel. Each of the variable inductors 74 and 78 has control inputs 79 for input of dc control currents, indicated as I and J. The load 12 might include, for example, a bias electrode in a plasma chamber. A return path will be provided through walls of the chamber, or through some other electrode, and the nature of the impedance will be predominantly capacitive, with a resistive power dissipating component.

Each of the shunt circuits, such as 72, 74 is electrically equivalent to a variable capacitor. The variable inductor value is designed to provide an adjustment range of approximately 30–40 percent of the inductor's nominal value. For example, an inductor having a nominal inductance value of 10 μH (microhenries) might be made adjustable down to a value of approximately 6.5 μH.

The X symbols in the diagram represent current transformers, by means of which current measurements are taken in each circuit branch in which an impedance is connected. Voltage is measured at the output of the network, as indicated at Y, and the network input voltage is already known from forward and reflected voltage measurements taken at the input. Specifically, the input voltage is the algebraic sum of the forward and reflected voltages. From these current and voltage measurements, the actual impedance values can be calculated for each of the impedances in the network. These calculated values are used to make corrections to the network model at each iteration of the control process.

The circuit of FIG. 7 differs in that the load 12' is predominantly inductive, with a resistive power dissipating component, and is positioned in the series-connected position of the fixed inductance 70 of the FIG. 6 configuration. The network 18' includes fixed capacitors 72' and 76' and variable inductors 74' and 78', connected in much the same manner as in FIG. 6. However, the circuit 18' has its output nodes connected to lines 20 and 22, instead of between line 22 and ground. Accordingly, although the two configurations are outwardly similar, different network models are needed for the two configurations. As in FIG. 6, the symbols X and Y indicate locations at which measurements of current and voltage, respectively, are taken.

Figure 8:
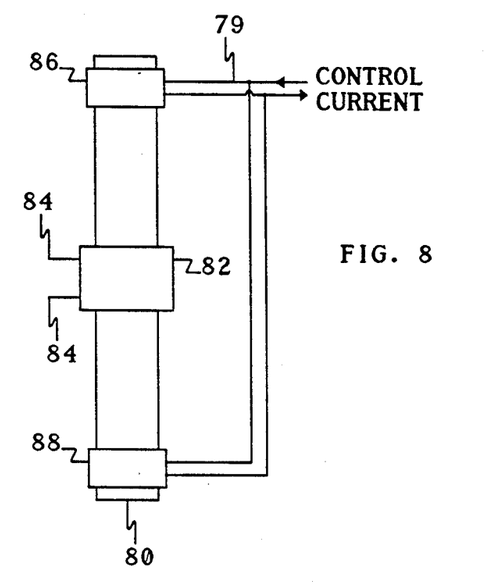
FIG. 8 is a diagrammatic view of a current-controlled inductance used in the preferred embodiment of the invention.

FIG. 8 is a diagrammatic depiction of one of the variable inductors used in the matching network of the presently preferred embodiment of the invention. The inductor consists of a cylindrical core 80 of soft ferrite material, or ferromagnetic or antiferromagnetic material, on which is wound an inductive coil 82, having terminals 84 for connection to the matching network 18 or 18'. The coil 82 is positioned near the center of the core 80. Near the ends of the core 80 are two control windings 86 and 88, through which dc control currents are applied through the terminals 79. The control windings 86 and 88 are shown as being connected in parallel, but may also be designed to be connected in series. An essential requirement is that the current applied to the two coils 86 and 88 should produce aiding magnetic fields, i.e. in the same direction in the core 80. Varying the direct current applied to the control windings 86 and 88 varies the inductance value seen at the terminals 84 of the inductive coil 82.

The design of the variable inductance depicted in FIG. 8 has the advantage that it is easier to manufacture than coils of toroidal configuration. Moreover, the rightcylindrical design lends itself to liquid cooling by simply enclosing the core in a cooling jacket through which a liquid, such as water, can be circulated. The windings may also be cooled, if necessary, by passing fluid through hollow conductors forming the windings, or by other means. An important aspect of the variable inductor design is that care must be taken to inhibit transformer action in which alternating current from the inductive coil 82 might be induced in the dc control windings 86 and 88. Transformer action can be minimized by a combination of electrostatic shielding of the control windings and appropriate filtering in the circuit supplying the control windings, and by physical separation of the control windings from the inductive coil.

In an important application of the invention, the electrical load is a plasma process. In a particular plasma process, power is coupled to the process by two different means. Source power for the process is inductively coupled into a process chamber, using a network configuration like the one shown in FIG. 7. Bias power for the same plasma process is applied through a bias electrode in the chamber, using a network configuration like the one shown in FIG. 6. In accordance with one aspect of the invention, the apparatus includes a matching network and a network model for each of these loads. Impedance matching of the bias load is not initiated until the principal, inductively coupled, load is impedance-matched to a desired degree.

Another importance aspect of the invention is to provide for plasma initiation. Plasma initiation requires that a sufficient electric field magnitude be developed within the gas in the plasma chamber. Preset values for the current controlled inductances may be calculated or experimentally determined for a specific matching network and plasma chamber.

In a preferred approach, the control system automatically finds the optimum values for the current controlled inductances, to achieve plasma initiation at minimum rf power. First, the preset values are arbitrarily chosen and used in the matching network and in the network model. Then rf power is applied to the matching network and the control system begins to automatically adjust the network values to achieve maximum power transfer, or some other selected condition. Even though the plasma has not yet been initiated, the control system still minimizes reflected power by tuning the small but nonzero losses in the network to the desired network input impedance. This resonates the matching network with the load, maximizing the electric field magnitude in the gas within the plasma chamber for a given rf power input. In effect, the electric field magnitude is maximized for a given rf input power, or the rf input power is minimized for a given electric field in the gas. The next step is to increase the rf power to the desired process power requirement, and plasma initiation is made possible at the lowest possible rf power. As plasma initiation occurs, the plasma impedance (which is the load impedance) changes, and the matching network follows those changes, tuning to the network input impedance as previously described. This plasma initiation method works both for inductively and capacitively coupled loads.

Specific details of the network model 32 depend, of course, on the configuration of the network itself. The model is simply an analog of the network, including equations that define how the network behaves when circuit parameters are varied. By way of illustration, details of the equations used in the model 32 will be specified for two network examples, namely the ones shown in FIGS. 6 and 7.

FIRST NETWORK MODEL EXAMPLE

The network configuration is shown in FIG. 6. Variable inductances 74 and 78 are referred to as $L_1$ and $L_2$, respectively. Fixed inductance 70 is referred to as $L_3$. Capacitors 72 and 76 are referred to as $C_1$ and $C_2$, respectively. The network values are $\alpha_1$ and $\alpha_2$, and these values are expressed in terms of multipliers to be applied to the variable inductances $L_1$ and $L_2$, respectively.

The following fixed values are used in this network model:

| | |
|---|---|
| Angular frequency, | $\omega = 2\pi \cdot 1.6 \cdot 10^6$ (radians/second) |
| | $s = j\omega$ |
| Capacitances, | $C_1 = 10{,}000 \cdot 10^{-12}$ (farads) |
| | $C_2 = 10{,}000 \cdot 10^{-12}$ (farads) |
| Inductances, | $L_1 = 1.2 \cdot 10^{-6}$ (henries) |
| | $L_2 = 0.86 \cdot 10^{-6}$ (henries) |
| | $L_3 = 3.65 \cdot 10^{-6}$ (henries) |

The transmission line characteristic impedance, i.e. the characteristic impedance of the directional coupler used to measure forward and reflected input voltage, is, in this example, the same as the conjugate of the generator impedance, and is referred to as $Z_o$. In this example, $Z_o = 50\Omega$, and the target network input impedance, referred to as $Z_T$, is also $50\Omega$. The initial network values are preset at $\alpha_1 = 0.9$ and $\alpha_2 = 0.884$.

Further, $Z_T = R_T + jX_T$. The prefixes Re and Im are sometimes used to refer to the real and imaginary components of a complex quantity. Thus, $R_T = \text{Re}(Z_T)$ and $X_T = \text{Im}(Z_T)$. Another quantity used in the example is $R_2$, where:

$$R_2 = R_T + \frac{X_T^2}{R_T}.$$

In the example, the voltage reflection coefficient $\Gamma$ is measured as:

$$\Gamma = 0.241 - j0.178, \text{ or}$$

$$\Gamma = 0.3 \cdot e^{j \cdot -36.4 \cdot \frac{\pi}{180}},$$

which means that the reflection coefficient has a magnitude of 0.3 and a phase angle of $-36.4$ degrees.

The input impedance as seen at the input terminals of the matching network, is given by:

$$Z_{IN} = Z_O \left[ \frac{1 + \Gamma}{1 - \Gamma} \right]$$

For the sample value of $\Gamma$, $Z_{IN} = 74.951 - j29.326$.

In the first phase of its operation, the network model computes the load impedance $Z_L$ from the current values of the impedances, using the following equation:

$$Z_L = \left[ \left[ \left[ \frac{1}{Z_{IN}} - \left[ \frac{1}{s \cdot \alpha_1 \cdot L_1} + s \cdot C_1 \right] \right]^{-1} - \right. \right.$$

$$s \cdot L_3 \bigg]^{-1} - \bigg[ \frac{1}{s \cdot a_2 \cdot L_2} + s \cdot C_2 \bigg]\bigg]^{-1}$$

Using the sample values given above, the value of $Z_L$ can be calculated from this equation to $Z_L = 10.669 - j\,27.007$. The magnitude of $Z_L$ is 29.038 and the phase angle is $-68.445$ degrees.

The second phase of operation of the network model involves computation of the values $\alpha_1$ and $\alpha_2$ using the computed value of $Z_L$, the target impedance $Z_T$ and the fixed impedance values. The computation is performed by first calculating a number of intermediate values, in accordance with the following equations:

$$dZqr = \frac{Re(Z_L)}{(|Z_L|)^2}, \quad dZqi = \frac{Im(Z_L)}{(|Z_L|)^2}, \quad Z_3 = \omega \cdot L_3,$$

$$dZc = \bigg[\frac{1}{Z_3}\bigg] \cdot \big[\sqrt{R_2 \cdot dZqr - (Z_3 \cdot dZqr)^2} - 1\big],$$

$$dZ2 = dZc - dZqi,$$

$$dX = \bigg[\frac{(1 + Z_3 \cdot dZc) \cdot dZc + Z_3 \cdot dZqr^2}{(1 + Z_3 \cdot dZc)^2 + (Z_3 \cdot dZqr)^2}\bigg].$$

Then the optimum values of $\alpha_1$ and $\alpha_2$ are computed as follows:

$$\alpha_1 = \frac{1}{L_1} \cdot \bigg[\omega^2 \cdot C_1 - \omega \cdot dX + \frac{\omega \cdot X_T}{X_T^2 + R_T^2}\bigg]^{-1} = 0.82,$$

$$\alpha_2 = \frac{1}{L_2} \cdot [\omega^2 \cdot C_2 + \omega \cdot dZ2]^{-1} = 0.941.$$

Two equally valid solutions can be calculated for $\alpha_1$ and $\alpha_2$, depending on whether the square root term in the expression for $dZc$ is considered as positive or negative. As a practical matter the solution selected is the one that physically achievable in the variable inductors. In the present example, the positive-root solution was selected.

As a check on the accuracy of the model, an equation for $Z_{IN}$ can be developed:

$$Z_{IN} = \bigg[\bigg[\frac{1}{s \cdot \alpha_1 \cdot L_1} + s \cdot C_1\bigg] + \bigg[s \cdot L_3 + \bigg[\bigg[\frac{1}{s \cdot \alpha_2 \cdot L_2} + s \cdot C_2\bigg] + \frac{1}{Z_L}\bigg]^{-1}\bigg]^{-1}\bigg]^{-1}$$

Substituting for $\alpha_1$ and $\alpha_2$ and for the other known parameters in this equation gives $Z_{IN} = 50$, which confirms the accuracy of the model.

The following material relates to correction or updating of the model based on measurement of actual currents and voltages in the matching network. To obtain the input parameters for the network model, the following quantities are measured:

$|V_f|$, the magnitude of the forward input voltage rf signal, $|V_r|$, the magnitude of the reflected input voltage rf signal, $\theta$, the relative phase between $V_f$ and $V_r$, $|V_2|$, the magnitude of the output rf voltage, at point Y in FIG. 6, $|IC_1|$, $|IL_1|$, $|IC_2|$, $|IL_2|$, the magnitudes of the currents through the tuning elements of the network.

The following quantities are then calculated from the measured quantities: The reflection coefficient is calculated as:

$$\Gamma = \frac{|V_r|}{|V_f|} e^{j\theta \cdot \frac{\pi}{180}}$$

Input voltage is calculated as:

$$V_1 = |V_f| \cdot |1 + \Gamma|$$

Then the values of $C_1$, $C_2$, $L_1$ and $L_2$ are calculated as:

$$C_1 = \frac{|IC_1|}{\omega \cdot |V_1|}, \quad \alpha_1 L_1 = \frac{|V_1|}{\omega \cdot |IL_1|},$$

$$C_2 = \frac{|IC_2|}{\omega \cdot |V_2|}, \quad \alpha_2 L_2 = \frac{|V_2|}{\omega \cdot |IL_2|}$$

To calculate the value of $L_3$, first an intermediate quantity $Z_f$ is calculated:

$$Z_f = \bigg[\frac{1}{Z_{IN}} - \bigg[j \cdot \omega \cdot C_1 + \frac{1}{j \cdot \omega \cdot \alpha_1 L_1}\bigg]\bigg]^{-1}$$

$$L_3 = \frac{1}{\omega} \cdot \bigg[Im(Z_f) + \sqrt{Z_f^2 \cdot \bigg(\frac{V_2}{V_1}\bigg)^2 - (Re(Z_f))^2}\bigg]$$

SECOND NETWORK MODEL EXAMPLE

The network configuration is shown in FIG. 7. Variable inductances 74' and 78' are referred to as $L_1$ and $L_2$, respectively. Capacitors 72' and 76' are referred to as $C_1$ and $C_2$, respectively. The network values are $\alpha_1$ and $\alpha_2$, and these values are expressed in terms of multipliers to be applied to the variable inductances $L_1$ and $L_2$, respectively.

The following fixed values are used in this network model:

| | |
|---|---|
| Angular frequency, | $\omega = 2\pi \cdot 2.5 \cdot 10^6$ (radians/second) |
| | $s = j\omega$ |
| Capacitances, | $C_1 = 4,100 \cdot 10^{-12}$ (farads) |
| | $C_2 = 967 \cdot 10^{-12}$ (farads) |
| Inductances, | $L_1 = 3.22 \cdot 10^{-6}$ (henries) |
| | $L_2 = 8.74 \cdot 10^{-6}$ (henries) |

The transmission line characteristic impedance, i.e. the characteristic impedance of the directional coupler used to measure forward and reflected input voltage, is, in this example, the same as the conjugate of the generator impedance, and is referred to as $Z_o$. In this example, $Z_o = 50\Omega$, and the target network input impedance, referred to as $Z_T$, is also $50\Omega$. The initial network values are preset at $\alpha_1 = 0.8$ and $\alpha_2 = 0.8$.

Further, $Z_T = R_T + jX_T$. The prefixes Re and Im are sometimes used to refer to the real and imaginary components of a complex quantity. Thus, $R_T = Re(Z_T)$ and $X_T = \text{Im}(Z_T)$. Another quantity used in the example is $R_2$, where:

$$R_2 = R_T + \frac{X_T^2}{R_T}.$$

In the example, the voltage reflection coefficient $\Gamma$ is measured as:

$$\Gamma = -0.195 + j0.045, \text{ or}$$

$$\Gamma = 0.2 \cdot e^{j167 \cdot \frac{\pi}{180}},$$

which means that the reflectance coefficient has a magnitude of 0.2 and a phase angle of 167 degrees.

The input impedance as seen at the input terminals of the matching network, is given by:

$$Z_{IN} = Z_O \left[ \frac{1+\Gamma}{1-\Gamma} \right]$$

For the sample value of $\Gamma$, $Z_{IN} = 33.572 + j3.147$.

In the first phase of its operation, the network model computes the load impedance $Z_L$ from the current values of the impedances, using the following equation:

$$Z_L = \left[ \frac{1}{Z_{IN}} - \left[ \frac{1}{j \cdot \omega \cdot \alpha_1 \cdot L_1} + j \cdot \omega \cdot C_1 \right] \right]^{-1} - \left[ \frac{1}{j \cdot \omega \cdot \alpha_2 \cdot L_2} + j \cdot \omega \cdot C_2 \right]^{-1}$$

Using the sample values given above, the value of $Z_L$ can be calculated from this equation to $Z_L = 11.041 + j180.224$. The magnitude of $Z_L$ is 180,562 and the phase angle is 86.494 degrees.

The second phase of operation of the network model involves computation of the values $\alpha_1$ and $\alpha_2$ using the computed value of $Z_L$, the target impedance $Z_T$ and the fixed impedance values, including $R_2$ and $X_2$, where:

$$R_2 = R_T + \frac{X_T^2}{R_T} = 50, \text{ and}$$

$$X_2 = \frac{R_2}{\sqrt{\left[ \frac{R_2}{\text{Re}(Z_L)} \right] - 1}} = 26.617.$$

The optimum values of $\alpha_1$ and $\alpha_2$ are computed from the following equation:

$$\alpha_1 = \frac{1}{L_1} \cdot \left[ \omega^2 \cdot C_1 - \frac{\omega}{X_2} + \frac{\omega \cdot X_T}{X_T^2 + R_T^2} \right]^{-1} = 0.737,$$

$$\alpha_2 = \frac{1}{L_2} \cdot \left[ \omega^2 \cdot C_2 + \frac{\omega}{\frac{X_2 \cdot R_2^2}{X_2^2 + R_2^2} - \text{Im}(Z_L)} \right]^{-1} = 0.817$$

Two equally valid solutions can be calculated for $\alpha_1$ and $\alpha_2$, depending on whether the square root term in the expression for dZc is considered as positive or negative. As a practical matter the solution selected is the one that physically achievable in the variable inductors. In the present example, the positive-root solution was selected.

As a check on the accuracy of the model, an equation for $Z_{IN}$ can be developed:

$$Z_{IN} = \left[ \left[ \frac{1}{j \cdot \omega \cdot \alpha_1 \cdot L_1} + j \cdot \omega \cdot C_1 \right] + \left[ \left[ \frac{1}{j \cdot \omega \cdot \alpha_2 \cdot L_2} + j \cdot \omega \cdot C_2 \right]^{-1} + Z_L \right]^{-1} \right]^{-1}$$

Substituting for $\alpha_1$ and $\alpha_2$ and for the other known parameters in this equation gives $Z_{IN} = 50$, which confirms the accuracy of the model.

The following material relates to correction or updating of the model based on measurement of actual currents and voltages in the matching network. To obtain the input parameters for the network model, the following quantities are measured:

$|V_f|$, the magnitude of the forward input voltage rf signal, $|V_r|$, the magnitude of the reflected input voltage rf signal, $\theta$, the relative phase between $V_f$ and $V_r$, $|V_2|$, the magnitude of the output rf voltage, at point Y in FIG. 7, $|IC_1|$, $|IL_1|$, $|IC_2|$, $|IL_2|$, the magnitudes of the currents through the tuning elements of the network.

The following quantities are then calculated from the measured quantities: The reflection coefficient is calculated as:

$$\Gamma = \frac{|V_r|}{|V_f|} e^{j\theta \cdot \frac{\pi}{180}}$$

Input voltage is calculated as:

$$V_1 = |V_f| \cdot |1 + \Gamma|$$

Then the values of $C_1$, $C_2$, $L_1$ and $L_2$ are calculated as:

$$C_1 = \frac{|IC_1|}{\omega \cdot |V_1|}, \quad \alpha_1 L_1 = \frac{|V_1|}{\omega \cdot |IL_1|},$$

$$C_2 = \frac{|IC_2|}{\omega \cdot |V_2|}, \quad \alpha_2 L_2 = \frac{|V_2|}{\omega \cdot |IL_2|}$$

It will be appreciated from the foregoing that the present invention represents a significant advance in the field of dynamic impedance matching networks, to maximize the power transferred to the load. In particular, the invention provides a reliable technique for matching a source impedance with a variable and unknown load impedance, by using a network model to estimate optimum network parameter values, and iteratively adjusting the network values in such a way as to converge rapidly on the maximum-power solution. It will also be appreciated that, although a specific embodiment of the invention has been described in detail by way of illustration, various modifications may be made without departing from the spirit and scope of the invention. Accordingly, the invention is not to be limited except as by the appended claims.

We claim:

1. A method for matching a generator impedance to an unknown load impedance, comprising the steps of:
   (a) connecting an impedance matching network, having at least two variable impedances, between an electrical generator and an electrical load, the network having input terminals connected to the generator and output terminals connected to the load;
   (b) taking electrical measurements to estimate the load impedance;
   (c) computing, in a model of the network, a set of optimum network values corresponding to the variable impedances, such that there would be a desired impedance match between the generator and the load if the estimated load impedance did not change;
   (d) adjusting the actual network values in a direction toward the optimum network values; and
   (e) repeating steps (b), (c) and (d) until a desired degree of impedance matching is obtained.

2. A method as defined in claim 1, wherein the adjusting step (d) includes:
   computing for each network value a difference between a present network value and the optimum network value;
   multiplying the difference for each network value by a selected scaling factor, to obtain a correction value; and
   adjusting each network value by the corresponding correction value.

3. A method as defined in claim 2, wherein the step of multiplying by a selected scaling factor includes:
   multiplying by a fixed constant value; and
   multiplying by a measured quantity indicative of the degree to which the network does not provide a desired impedance match, whereby smaller corrections will be used as the network approaches the desired impedance match.

4. A method as defined in claim 3, wherein:
   the desired impedance match provides for maximum power transfer from the generator to the load; and
   the step of multiplying by a measured quantity includes multiplying by a measured reflection coefficient magnitude, whereby a low reflection coefficient magnitude is indicative of a high degree of impedance matching.

5. A method as defined in claim 3, and further comprising:
   determining whether a selected threshold level of convergence on the impedance matching condition has been reached; and, if it has,
   modifying each correction value to include an additional component proportional to an accumulated product of difference value and elapsed time between samples, whereby the additional component provides for an increased correction value to accelerate convergence in its latter stages.

6. A method as defined in claim 1, and further comprising the step of:
   (f) correcting the network model to reflect actual network values measured in the network.

7. A method as defined in claim 1, wherein:
   the step (d) of adjusting the network values includes changing control currents or voltages applied to electronically controlled inductances in the network.

8. A method as defined in claim 1, wherein:
   the electrical load is a plasma process.

9. A method for matching a generator impedance to an unknown load impedance, comprising the steps of:
   (a) connecting an impedance matching network, having at least two variable impedances, between an electrical generator and an electrical load, the network having input terminals connected to the generator and output terminals connected to the load;
   (b) initializing the present network values, corresponding to the variable impedances in the network, to preselected initial values;
   (c) determining a network input impedance from measurements taken at the input terminals of the network;
   (d) estimating the load impedance using a network model having knowledge of the network input impedance and the present network values;
   (e) estimating optimum network values, using the network model, based on the estimated load impedance and a desired network input impedance;
   (f) computing new network values from the present and optimum values;
   (g) adjusting the present network values to the new values computed in the previous step; and
   (h) repeating steps (c) through (g) until there is a desired degree of convergence with a condition of maximum power transfer.

10. A method as defined in claim 9, wherein the adjusting step (g) includes:
    computing for each network value a difference between a present network value and the optimum network value;
    multiplying the difference for each network value by a selected scaling factor, to obtain a correction value;
    adjusting each network value by the corresponding correction value.

11. A method as defined in claim 10, wherein the step of multiplying by a selected scaling factor includes:
    multiplying by a fixed constant value; and
    multiplying by a measured quantity indicative of the degree to which the network does not provide a desired impedance match, whereby smaller correction will be used as the network approaches the desired impedance match.

12. A method as defined in claim 11, wherein:
    the step of multiplying by a measured quantity includes multiplying by a measured reflection coefficient magnitude, whereby a low reflection coefficient magnitude is indicative of a high degree of impedance matching.

13. A method as defined in claim 11, and further comprising:
    determining whether a selected threshold level of convergence on the maximum-power matching condition has been reached; and, if it has,
    modifying each correction value to include an additional component proportional to an accumulated product of difference value and elapsed time between samples, whereby the additional component provides for an increased correction value to accelerate convergence in its latter stages.

14. A method as defined in claim 9, and further comprising the steps of:
    (i) taking current and voltage measurements in the network;
    (j) determining actual network impedance values from the current and voltage measurements; and (k) correcting the network model to reflect actual network values as measured in the network.

15. A method as defined in claim 9, wherein:
the step (g) of adjusting the network values includes changing control currents or voltages applied to electronically controlled inductances in the network.

16. A method as defined in claim 9, wherein: the electrical load is a plasma process.

17. A method as defined in claim 16, wherein: power is inductively coupled to the plasma process.

18. A method as defined in claim 16, wherein: power is capacitively coupled to the plasma process.

19. A method as defined in claim 16, wherein:
the electrical load is inductively coupled to the network, and the generator is the principal power source for the plasma process; and
the method further comprises an additional set of steps identical with steps (a) through (h), but performed with respect to a second plasma load to which power is coupled through a bias electrode in the same plasma process.

20. A method as defined in claim 19, wherein:
the additional set of steps is not performed until convergence is reached with respect to the original set of steps (a) through (h), whereby the impedance matching is performed with respect to the inductively coupled plasma load and then with respect to the second plasma load.

21. A method as defined in claim 9, wherein:
the step (c) of determining the network input impedance includes measuring a voltage reflection coefficient at the network input terminals, and calculating the network input impedance from the voltage reflection coefficient.

22. A method as defined in claim 21, and further comprising:
(i) prior to step (h), comparing the measured voltage reflection coefficient with a preselected threshold, to determine whether the desired degree of convergence has been reached;
(j) repeating step (i) after the desired degree of convergence has been reached, to determine whether to initiate further adjustments of the network values.

23. Apparatus for matching a generator impedance to an unknown load impedance, the apparatus comprising:
(a) an impedance matching network, having at least two variable impedances, connected between an electrical generator and an electrical load, the network having input terminals connected to the generator and output terminals connected to the load;
(b) means for initializing the present network values, corresponding to the variable impedances in the network, to preselected initial values;
(c) means for determining a network input impedance from measurements taken at the input terminals of the network;
(d) a network model, for estimating the load impedance from the network input impedance and the present network values, and for estimating optimum network values from the estimated load impedance and a desired network input impedance; and
(e) a system controller, for computing new network values from the present and optimum values, adjusting the present network values to the new values, and iteratively initiating operations of the network model to obtain revised optimum, until there is a desired degree of convergence with a condition of maximum power transfer.

24. Apparatus as defined in claim 23, wherein the system controller further includes:
means for computing for each network value a difference between the present network value and the optimum network value;
means for multiplying the difference for each network value by a selected scaling factor, to obtain a correction value; and
means for adjusting each network value by the corresponding correction value.

25. Apparatus as defined in claim 24, wherein the means for multiplying by a selected scaling factor includes:
means for multiplying by a fixed constant value; and
means for multiplying by a measured quantity indicative of the degree to which the network does not provide a desired impedance match, whereby smaller correction will be used as the network approaches the desired impedance match.

26. Apparatus as defined in claim 25, wherein:
the means for multiplying by a measured quantity uses a measured reflection coefficient magnitude as the measured quantity, whereby a low reflection coefficient magnitude is indicative of a high degree of impedance matching.

27. Apparatus as defined in claim 25, and further comprising:
means for determining whether a selected threshold level of convergence on the maximum-power matching condition has been reached; and
means operative only if the threshold level has been reached, for modifying each correction value to include an additional component proportional to an accumulated product of difference value and elapsed time between samples, whereby the additional component provides for an increased correction value to accelerate convergence in its latter stages.

28. Apparatus as defined in claim 23, and further comprising:
means for taking current and voltage measurements in the network;
means for determining actual network impedance values from the current and voltage measurements; and
means for correcting the network model to reflect actual network values as measured in the network.

29. Apparatus as defined in claim 23, wherein:
the network includes electronically controlled inductances;
the system controller includes, for use in adjusting the network values, means for changing control currents or voltages applied to the electronically controlled inductances in the network.

30. Apparatus as defined in claim 23, wherein:
the electrical load is a plasma process.

31. Apparatus as defined in claim 30, wherein:
power is inductively coupled to the plasma process.

32. Apparatus as defined in claim 30, wherein:
power is capacitively coupled to the plasma process.

33. Apparatus as defined in claim 30, wherein:
the electrical load is inductively coupled to the network, and the generator is the principal power source for the plasma process; and
the apparatus further comprises an additional set of components identical to (a) through (e), the additional components being coupled to a second plasma load to which power is coupled through a bias electrode in the same plasma process.

34. Apparatus as defined in claim 33, wherein:
the additional set of components is not actuated until convergence is reached with respect to the original set of components (a) through (e), whereby impedance matching is performed with respect to the inductively coupled plasma load and then with respect to the second plasma load.

35. Apparatus as defined in claim 23, wherein:
the means for determining the network input impedance includes means for measuring a voltage reflection coefficient at the network input terminals, and means for calculating the network input impedance from the voltage reflection coefficient.

36. Apparatus as defined in claim 35, and further comprising:
means for comparing the measured voltage reflection coefficient with a preselected threshold, to determine whether the desired degree of convergence has been reached; and
means for suspending operation of the apparatus after the desired degree of convergence has been reached, until the match condition is no longer in effect.

37. Apparatus as defined in claim 23, wherein:
the network includes electronically controlled inductances, each of which has a magnetic core, an inductance coil wound on the core, and at least one dc control coil wound on the core, wherein the control coil applies a controllable magnetomotive force to the core, to vary the inductance of the inductance coil.

38. Apparatus as defined in claim 37, wherein:
there are two control coils;
the magnetic core is a generally straight rod; and
the inductance coil is positioned near the center of the rod and the control coils are positioned near the ends of the rod.

* * * * *